United States Patent
Clarke

(10) Patent No.: US 11,506,692 B2
(45) Date of Patent: Nov. 22, 2022

(54) ULTRA-LOW LEAKAGE TEST VERIFICATION CIRCUIT

(71) Applicant: Automatic Timing & Controls, Inc., Newell, WV (US)

(72) Inventor: Roger Clarke, Newell, WV (US)

(73) Assignee: Automatic Timing & Controls, Inc., Newell, WV (US)

( * ) Notice: Subject to any disclaimer, the term of this patent is extended or adjusted under 35 U.S.C. 154(b) by 0 days.

(21) Appl. No.: 16/948,405

(22) Filed: Sep. 17, 2020

(65) Prior Publication Data

US 2022/0082594 A1    Mar. 17, 2022

(51) Int. Cl.
| | | |
|---|---|---|
| G01R 19/165 | (2006.01) | |
| G01R 31/52 | (2020.01) | |
| G01R 31/327 | (2006.01) | |
| G01R 31/26 | (2020.01) | |

(52) U.S. Cl.
CPC .  *G01R 19/16519* (2013.01); *G01R 19/16523* (2013.01); *G01R 31/2621* (2013.01); *G01R 31/327* (2013.01); *G01R 31/52* (2020.01)

(58) Field of Classification Search
CPC .......... G01R 19/16519; G01R 31/2601; G01R 31/2608; G01R 31/2621; G01R 31/00; G01R 31/50; G01R 31/52; G01R 31/327; G01R 19/16523
See application file for complete search history.

(56) References Cited

U.S. PATENT DOCUMENTS

| | | | |
|---|---|---|---|
| 2016/0124037 A1* | 5/2016 | Zhang | G01R 31/3275 324/762.08 |
| 2017/0269128 A1* | 9/2017 | Bugaris | G01R 19/155 |
| 2019/0391186 A1* | 12/2019 | Bollman | G01R 15/144 |

* cited by examiner

*Primary Examiner* — Son T Le
(74) *Attorney, Agent, or Firm* — Fay Sharpe LLP

(57) ABSTRACT

A test verification circuit is described herein for verifying proper operation of a tested circuit, such as a voltage hazard warning circuit, using an N-channel MOSFET configured for switching ON and OFF the test verification circuit during a power outage, and a voltage source that provides an input voltage to the N-channel MOSFET from a conserved power supply. The N-channel MOSFET provides temporary power from a conserved power supply to the test verification circuit upon activation by a user during a power outage, and the test verification circuit determines whether the tested circuit has been de-energized, remains energized, or there remains inadequate power to complete the test.

17 Claims, 2 Drawing Sheets

ULTRA-LOW LEAKAGE TEST VERIFICATION CIRCUIT

FIELD OF THE INVENTION

The following relates to the electrical power arts. It particularly relates to monitoring a safe electrical disconnection of a high voltage circuit for servicing, and will be described with particular reference thereto. However, the following will also find application in routine monitoring of electrical line voltages and in other aspects of electrical safety.

BACKGROUND

To ensure safety during servicing of electrical systems and circuits which carry high voltages, a "lockout/tagout" procedure is typically followed. A circuit breaker or ON/OFF switch that delivers power to the circuit to be serviced is opened or disengaged to disconnect electrical power from the circuit, and the breaker is physically locked into the opened or disengaged position using a padlock or other device (the "lockout"). Additionally, the servicing electrician affixes a tag to the physically locked breaker that provides information such as the electricians' identity and contact information, service authorization information, and the like (the "tagout"). The tag typically is bright red or otherwise prominently displayed, and includes a plain language warning that only the installing electrician is authorized to remove the lockout/tagout and reenergize the circuit.

The lockout/tagout procedure greatly reduces the possibility of human error causing inadvertent application of power to the circuit under service. However, safety can be compromised even when the lockout/tagout procedure is properly followed, due to various potential sources of dangerously high voltages in the isolated circuit. For example, potential unexpected sources of DC energy include line capacitance, bypass capacitors, or power factor correction banks. Potential unexpected sources of AC energy include standby power generators, motor back-EMF, or human operation of an associated switch. Moreover, power ON/OFF switches or circuit breakers are not immune to failure, and the locked out breaker could potentially still be transmitting power.

Recognizing that the most dangerous power panel or box can be the one believed to be at zero energy potential, the Occupational Safety and Health Administration (OSHA) has issued regulation OSHA 1910.147 entitled "Control of Hazardous Energy (Lockout/Tagout)" which includes identification of residual or stored energy as a hazard. OSHA 1910.147 requires that electrical isolation be verified after lockout/tagout (LOTO). Furthermore, it requires that the verification of isolation continue throughout the electrical servicing if there is a possibility of re-accumulation of hazardous levels of stored energy.

To verify electrical isolation, electrical safety monitors which monitor electrical energy potentials of monitored electrical lines of an electrical panel are utilized. The electrical safety monitors provide a warning with light emitting diode ("LED") indicators in response to an electrical potential being present on the monitored lines. During servicing, electricians verify normal operation of the indicators while the panel is powered and then verify all of the indicators are extinguished while the panel is powered down before opening the panel. Although electrical safety monitors have proven to be reliable, final verification by lack of illumination provides less assurance than desired due to the possibility of circuit failure or malfunction which could likewise be the culprit for extinguished indicators and not just the absence of voltage on the monitored lines.

Additionally, although the operating current required for indication is extremely low, typically less than 1 milliampere at 750 VAC 3-phase, the electrical safety monitors are rated for 750 VAC continuous operation and the monitored line voltages entering the monitor are at full 3-phase line voltage potentials. To further electrical isolate the electrical safety monitors due to the high energy potential during operation, the housing of these monitors are typically non-conductive and the electronics are fully encapsulated in a high quality thermoset potting compound.

The following description contemplates an improved approaches that overcome the aforementioned limitations and others.

SUMMARY

According to one aspect described herein, an ultra-low leakage test verification circuit for verifying proper operation of a tested circuit comprises an N-channel MOSFET configured for switching ON and OFF the test verification circuit during a power outage, and a voltage source that provides an input voltage to the N-channel MOSFET from a conserved power supply. The N-channel MOSFET provides temporary power from a conserved power supply to the test verification circuit upon activation by a user during a power outage. The test verification circuit determines whether the tested circuit has been de-energized, remains energized, or there remains inadequate power to complete the test.

According to another aspect described herein, a system that facilitates verifying operation of a tested circuit during a power outage comprises an ultra-low leakage test verification circuit for verifying proper operation of shock hazard warning circuit, an N-channel MOSFET configured for switching ON and OFF the test verification circuit during said power outage, and a voltage source that provides an input voltage to the N-channel MOSFET, and a tested circuit that is diagnosed by the test verification circuit upon activation of the test verification circuit by a user during said power outage. The N-channel MOSFET provides temporary power from a conserved power supply to the test verification circuit upon activation by the user. The test verification circuit verifies whether the tested circuit has been de-energized.

Still further advantages of the subject innovation will be appreciated by those of ordinary skill in the art upon reading and understanding the following detailed description.

BRIEF DESCRIPTION OF THE DRAWINGS

The present invention will be understood and appreciated more fully from the following detailed description taken in conjunction with the appended drawings in which.

DETAILED DESCRIPTION

In selecting a discrete MOSFET or integrated chip (IC) to act as a high side power switch to activate a load or circuit, a number of specifications can be taken into account. If the circuit is used in a portable device and necessarily operates under battery power or a capacitive storage charge, then there is a risk of losing power if the circuit is inadvertently left in the ON mode too long or if the circuit requires continual connectivity (as a power switch always on) to achieve operation on demand. For either case, the off state leakage current specification of the MOSFET or IC is determinative of total operational life as its inherent leakage current acts to slowly deplete the charge.

A discrete N-channel MOSFET has a key advantage over P-channel MOSFET counterparts in that it provides a significantly lower OFF state leakage current. Conventional systems employ P-channel enhancement mode MOSFETs to directly switch high side power ON and OFF, with N-channel MOSFETs reserved to directly switch negative side power. For circuits requiring high side power switching, the claimed innovation introduces additional circuit complexity while providing an effective design to allow for the application of an N-channel MOSFET with preferred characteristics as an alternative to use of a common P-channel design on the high side.

With no voltage from gate to source (VGS) an enhancement P-channel MOSFET acts as an open circuit across its Drain to Source. As VGS becomes more negative, the MOSFET channel becomes conductive, passing current from Drain to Source enabling a series load to change from an "off" state to an "on" state, as in high side power switching. The complementary component to a conventional P-channel device is an N-channel enhancement MOSFET. The problem in attempting to allocate the N-channel MOSFET to accomplish high side power switching is the necessity of applying a higher voltage potential on the gate terminal than the source terminal that transfers voltage to the load. The potential switched to the load is usually the full circuit voltage. In other words, to maintain conduction at maximum current, a minimal amount of positive VGS potential in excess of the voltage switched to the load is needed. Unless an adequately higher potential than the desired switched load voltage is used to produce VGS, then a switching inefficiency occurs producing a voltage drop across Drain to Source (VDS) and thus less voltage is delivered to the load. The amount of VDS drop or loss is a function of the MOSFET driving voltage (VGS) and current demand of the load. This VDS inefficiency or the switched voltage loss as a percentage of supplied voltage naturally becomes more pronounced for applications delivering lower load voltages and is yet worse as current demand increases.

Figure 1:
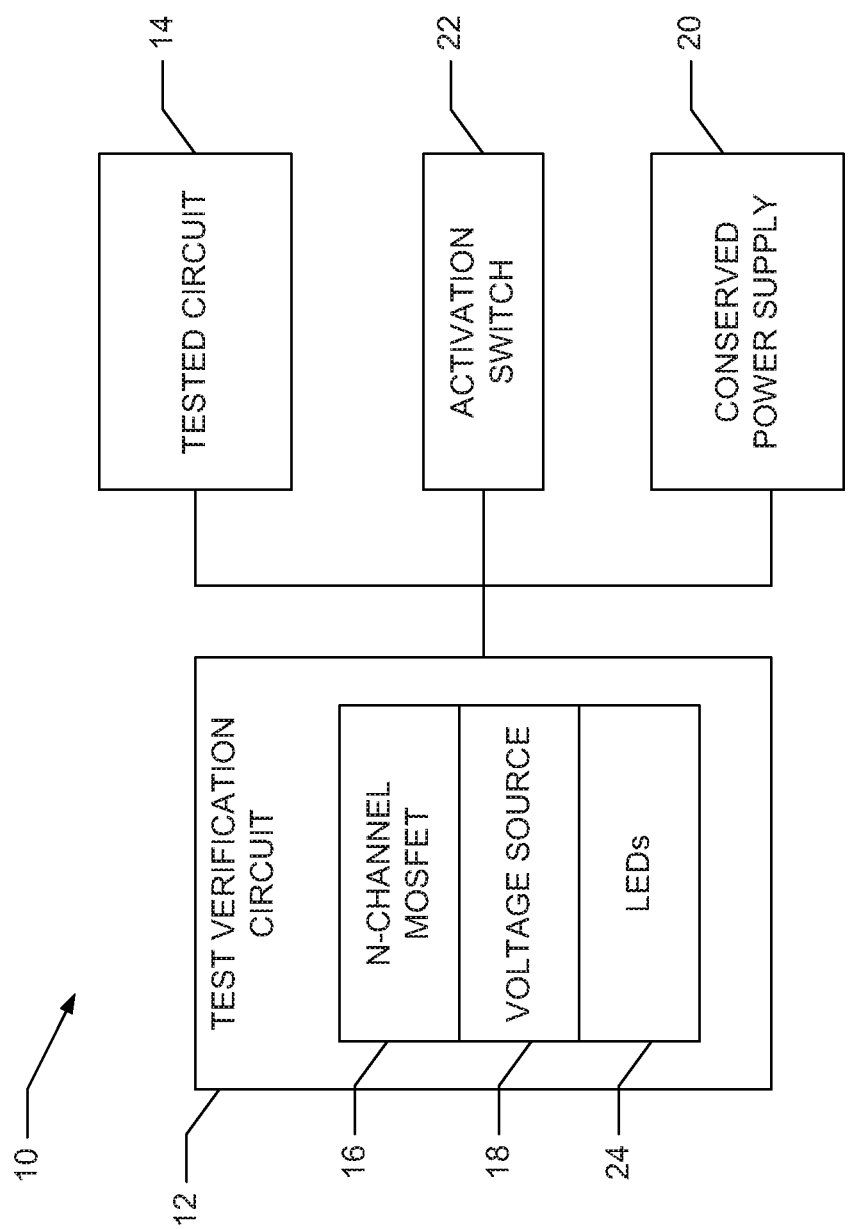
FIG. 1 illustrates a system that facilitates verifying operation of a tested circuit during a power outage.

FIG. 1 illustrates a system 10 that facilitates verifying operation of a tested circuit during a power outage. The system 10 comprises an ultra-low leakage test verification circuit 12 for verifying proper operation of a tested circuit 14. Various embodiments and circuits described herein are related to subject matter described un U.S. Pat. No. 9,013,296, which is hereby incorporated by reference herein in its entirety.

The test verification circuit comprises an N-channel MOSFET 16 configured for switching ON and OFF the test verification circuit during a power outage (e.g., AC or DC), and a voltage source 18 that provides an input voltage to the N-channel MOSFET from a conserved power supply 20. The N-channel MOSFET provides temporary power from the conserved power supply to the test verification circuit upon activation of a switch 22 by a user during a power outage. The switch 22 comprises a user-activatable mechanism configured to provide activation of the N-channel MOSFET when temporarily powering the test verification circuit. The test verification circuit determines whether the tested circuit has been de-energized, remains energized, or there remains inadequate power to complete the test of the tested circuit.

The test verification circuit further comprises one or more light emitting diodes (LEDs) 24 that provide visual confirmation of tested circuit status upon activation of the test verification circuit by the user. In one non-limiting example, the plurality of LEDs comprises eight LEDs. For instance, the test verification circuit 12 can be configured to indicate that the tested circuit 14 has been de-energized via a first LED status indicator having a first color. In another embodiment, the test verification circuit is configured to indicate that the test circuit remains energized via a second LED status indicator having a second color. In another embodiment, the test verification circuit is further configured to indicate that the test of the tested circuit cannot be completed due to an inadequate supply of power via a third LED status indicator having a third color.

In one embodiment, the voltage source 18 is a voltage multiplier circuit (e.g., U3 in FIG. 2) that receives power sourced from a voltage regulator (e.g. U2) which in turn sources power from the conserved power supply. The voltage multiplier circuit is configured to bias a potential at a gate of the N-channel MOSFET to a level greater than an operational voltage of the test verification circuit e.g., raised higher by a minimum of the FET's $V_{GS}$. In one non-limiting example, the voltage multiplier is a voltage doubler.

According to another embodiment, the conserved power supply comprises a supercapacitor that conserves charge upon a power outage for use by the N-channel MOSFET upon activation of the test verification circuit by the user via the switch. In another example, the power supply comprises a battery (not shown).

Figure 2:
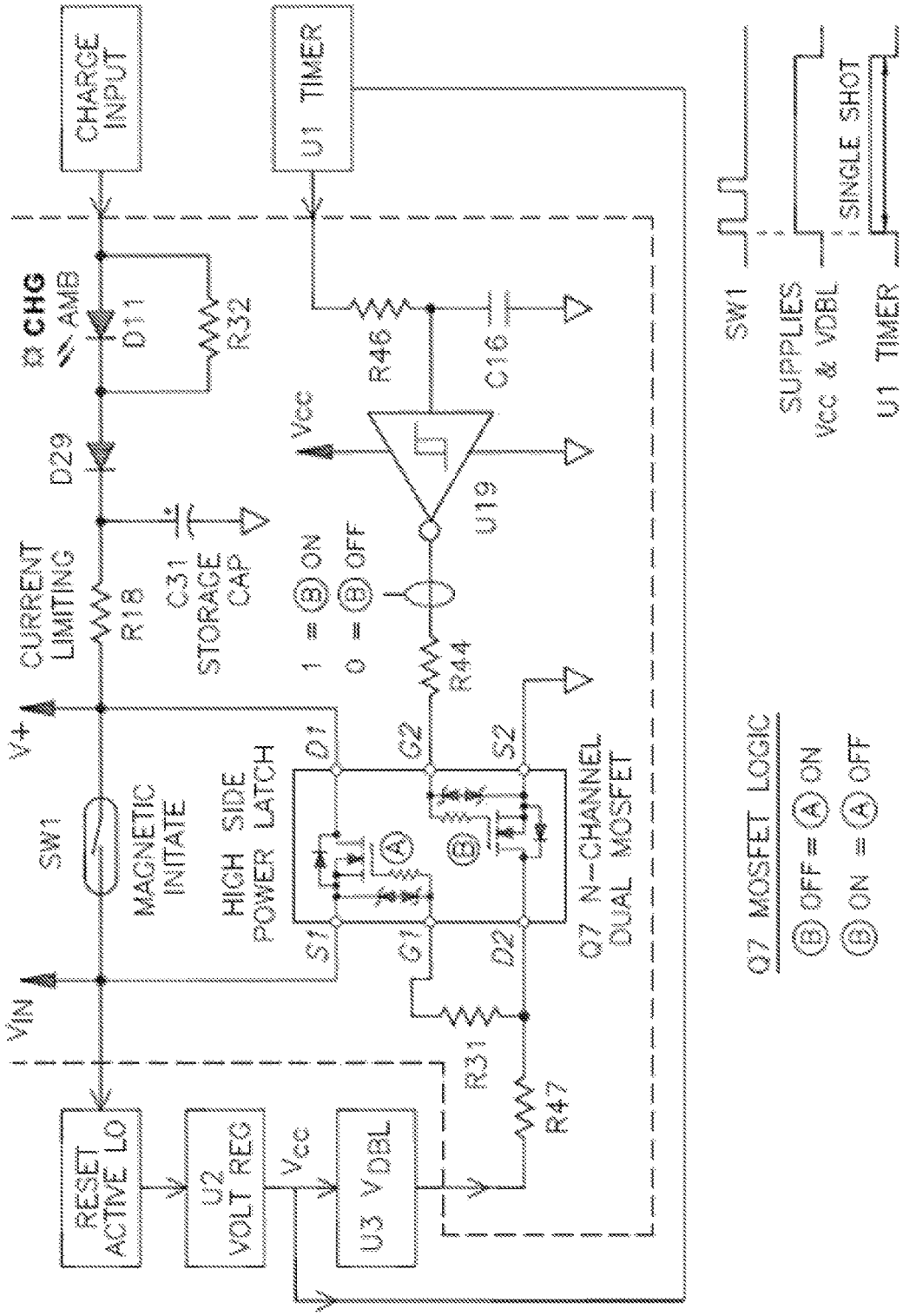
FIG. 2 shows a schematic diagram of an ultra-low leakage high-side power latch circuit for turning on an N-channel MOSFET for test circuit verification, in accordance with one or more features described herein.

With continued reference to FIG. 1, FIG. 2 shows a schematic diagram of an ultra-low leakage high-side power latch circuit for turning on an N-channel MOSFET for test circuit verification, in accordance with one or more features described herein. In the Example of FIG. 2, the voltage source is described as $V_{DBL}$ a voltage doubler. However, those of skill in the art will recognize that other voltage multipliers may be used in conjunction with the various embodiments described herein.

Line power is first conditioned before reaching the Charge Input. The charge current level is reflected by the intensity of the charge (CHG) LED D11. In one example, the LED D11 is amber in color, although other colors may be contemplated. When control voltage is applied to the device and storage capacitor C31 is initially fully discharged, then intensity of D11 is at a maximum. As C31 charges, the intensity of D11 slowly diminishes and is fully extinguished at maximum charge (e.g., 7.7 Vdc or some other suitable maximum charge). When the forward voltage drop of D11 no longer passes current to C31, then the paralleled trickle charge resistance R32 continues to pass current to deliver a higher peak charge voltage, overcoming the voltage drop limitation of D11. Since C31 is of large capacity, it requires some time to fully charge. Observing the illumination intensity of the charge (CHG) indicator then becomes valuable in approximating the storage capacitor charge level at any given time. Verification can be made that indicator D11 is fully extinguished (and thus C31 is fully charged) before a power disconnect and subsequent test(s) are performed. To prevent discharge of C31 back through the charging path of R32 including reverse leakage through D11, the series diode D29 serves to block reverse current flow. Should at any time a power disconnect occur or line voltages drop so low as to be insufficient to maintain the present C31 charge level, reverse leakage current acting to slowly discharge D31 can be blocked by D29, which is selected to have an extremely low reverse leakage specification. Since the mentioned charging components present a path for some finite reverse leakage and C31 naturally has internal leakage, D29 can reduce total storage discharge to better preserve energy toward performing elicited tests. After a power outage, the number of tests that can be performed decreases over time. Additionally, as operating temperature increases, OFF state leakage current of MOSFETs also increase, further reducing available stored charge for test verification. This problem is mitigated by the herein-described arrangement comprising an N-channel MOSFET and an innovative power supply for biasing a gate voltage thereof in order to turn on the MOSFET.

The herein-described device can be fully encapsulated and is equipped with an internal reed switch SW1 (or other switching means) which can be magnetically actuated by an operator to elicit a limited number of self-diagnostic test verifications of operation. This test is normally preceded by first verifying proper operation of the device under normal conditions while panel power is on. Once a Lock-Out-Tag-Out procedure is properly followed to disconnect and de-energize the monitored panel or circuit, the device is observed to verify that all line voltage LED indicators are extinguished. The diagnostic test is then performed by passing a magnet in close proximity to a horseshoe magnet symbol on the front label with SW1 located internally behind this label area. The test adds further assurance of continued operational integrity of the device's internal circuitry that drives line voltage detection LEDs (1 pair of + and − polarity detecting LEDs for each line: L1, L2, L3, GND). At any time before, during, or after the test, the line LED indicators remain responsive to AC or DC voltage conditions across any two combinations of the monitored lines that are in excess of a detection threshold voltage, which more importantly is set below a shock hazard voltage level for safety. During a powered down test, stored energy in C31 is used to temporarily power all the detection circuits and temporally illuminate all corresponding LED indicators. In addition to verifying operation of the line LED indicator circuits, during the test a dedicated test status indicator (e.g., a green LED or the like) illuminates if all external voltages are below the detection threshold voltage (e.g., 14 to 18 V). If any of the monitored voltages were above the detection threshold when the test was initiated, a corresponding status indicator LED (e.g., red or some other suitable color) illuminates instead of the Green. After initiation of a test, SW1 closure transfers voltage directly from V+ to VIN which in turn feeds voltage to the power supply regulator U2. When VIN exceeds the U16 Voltage Detector's Active Lo Reset point of, e.g., 2.5v, the reset output goes high which enables operation of U2 Voltage Regulator.

According to an example, with U2 enabled, Vcc regulator output voltage initiates near the same voltage as VIN at e.g., 2.4-2.5 v, depending on the circuit load. Once VIN reaches 3.4 v and higher toward 7.7 v, U2 is in regulation and maintains Vcc at 3.4 v with greater allowance for circuit load variation. Vcc provides power to the circuit's logic and linear ICs as well as U3 Voltage Doubler. The U3 Voltage Doubler allocates the Vcc input voltage and internally doubles it at the output for supplying $V_{DBL}$, as its name implies. Vcc also powers the U1 Timer which functions as a single shot time delay. U1 output is logic "1" for the duration of the delay and connects to input of U19 Schmitt Inverter by current limiting resistor R46 and filter capacitor C16. The Inverter outputs a logic "0" to the gate G2 of Q7 B N-Channel MOSFET, which also includes a source S2 and a drain D2, keeping Q7 B in the turned off or open state. While Q7 B is open, the boosted VDBL supply voltage released to the gate G1 of Q7 A N-Channel MOSFET is first divided down by the resistor ratio of R47 and R31. MOSFET Q7 A also includes a drain D1 and a source S1. With adequate gate voltage, Q7 A turns on or is in the closed state for the duration of the delay. Should a circuit fault occur, resistor R18 limits current to protect both SW1 and Q7 A and the discharge rate from C31. The Q7 A MOSFET functions as a solid-state latch and being in parallel with switch SW1, electronically latches power to the circuit "on" until the U1 Timer delay expires completing one test cycle. The test circuit re-initializes when U1 Timer goes low causing the inverter to change state to a logic "1" which in turn delivers voltage to Q7 B gate through R44. With MOSFET Q7 B now turned on, the drain sinks current bringing Q7 A gate voltage near to zero turning Q7 A back off. With SW1 in the open state and Q7 A off, voltage source 18 then de-energizes. For proper operation of Q7 A to be in an "on state" requires a Gate Threshold Voltage (VGS) ranging from 0.8 to 1.5 v. The minimum voltage potential that must occur between the Q7 A gate to ground is the summation of VGS and the voltage delivered to the load or 3.4 v, (i.e. VGS range+3.4 v=4.2 to 4.9 v).

With the input to the Voltage Doubler regulated at 3.4 v, the output created is 3.4 v×2=6.8 v, more than adequate to supply a worst case minimum gate voltage of 4.9 v to drive Q7 A (calculated above). As the charge voltage on C31 depletes and the voltage regulator begins to de-regulate and drop from 3.4 v to about 3.1 v, the test circuit detects this transition point then stops current delivery to the (8) indicators. A low charge (LO CHG) status indicator (e.g., amber or some other suitable color) then begins to flash until the test period ends, indicating that the storage capacitance needs to be re-charged if more tests are to be conducted.

Re-charging is achieved by re-applying control voltage at an opportune time and waiting for the charge (CHG) indicator D11 to extinguish. The storage charge on C31 can begin to rejuvenate upon re-application of adequate AC or DC voltage between any two or more of the four input lines. Since large amounts of highly condensed Storage Energy can be potentially hazardous, the internal storage charge was limited to a maximum of only 0.0775 coulombs or 0.0215 mAh. Operational adequacy of such low capacity is attributed to high efficiency and extremely low power usage. Without a re-charge, the voltage can reduce further so that VIN falls below U16 Voltage Detector's Active Lo Reset point of 2.5 v. When that occurs, the reset output goes low which disables operation of U2 Voltage Regulator. This results in the loss of Vcc and thus the VDBL supply which in turn prevents both Q7 A and Q7 B MOSFETS from turning on. These circuits and associated LED indicators turning off is beneficial to greatly slow a complete depletion of the C31 storage capacitor voltage.

Since Vcc, VDBL, and both MOSFETS remain operational just above VIN of 2.5 v, examination of operation of the Q7 A MOSFET down to that level can be performed by a user. The minimum necessary gate to ground voltage to drive Q7 A would be (VGS+VLOAD)=(1.5 v+2.5 v)=4 v. The available voltage from the Voltage Doubler or VDBL would be (2×2.5 v) or 5 v which is still adequately more than 4 v.

In this manner, with the aid of the Voltage Doubler output, the described circuit is able to drive the N-Channel MOSFET Q7 A using a storage charge source voltage down to approximately 2.5 v. That is, a storage charge range from 7.7 v to 2.5 v or as a percentage, is operational to a deep discharge of 68% from maximum storage capacity. Without the use of the described Voltage Doubler, the storage charge source itself would necessarily be used to supply the minimum gate to ground voltage of 4 v to drive Q7 A. The storage charge would then range from 7.7 v to 4 v or as a percentage, remain operational to 48% of maximum, a −20% disadvantage.

Furthermore, by using such a low capacity power supply, (i.e., C31), a safety advantage is achieved when compared to, e.g., Lithium Ion batteries or the like.

The claimed innovation has been described with reference to the various embodiments. Modifications and alterations will occur to others upon reading and understanding the preceding detailed description. It is intended that the embodiments described herein be construed as including all such modifications and alterations insofar as they come within the scope of the appended claims or the equivalents thereof.

Having thus described the preferred embodiments, the invention is now claimed to be:

1. An ultra-low leakage test verification circuit for verifying proper operation of a tested circuit, comprising:
   an N-channel MOSFET configured for switching ON and OFF the test verification circuit during a power outage; and
   a voltage source that provides an input voltage to the N-channel MOSFET from a conserved power supply;
   wherein the N-channel MOSFET provides temporary power from a conserved power supply to the test verification circuit upon activation by a user during a power outage;
   wherein the test verification circuit determines whether the tested circuit has been de-energized, remains energized, or there remains inadequate power to complete the test;
   wherein the voltage source is a voltage multiplier circuit that receives power from the conserved power supply; and
   wherein the voltage multiplier circuit biases a potential at a gate of the N-channel MOSFET to a level greater than an operational voltage of the test verification circuit.

2. The test verification circuit according to claim 1, further configured to indicate that the test circuit has been de-energized via a first LED status indicator having a first color.

3. The test verification circuit according to claim 1, further configured to indicate that the test circuit remains energized via a second LED status indicator having a second color.

4. The test verification circuit according to claim 1, further configured to indicate that the test circuit cannot be completed due to an inadequate supply of power via a third LED status indicator having a third color.

5. The test verification circuit of claim 1, wherein the voltage multiplier is a voltage doubler.

6. The test verification circuit according to claim 1, wherein the power supply comprises a supercapacitor that conserves charge upon a power outage for use by the N-channel MOSFET upon activation of the test verification circuit by the user.

7. The test verification circuit according to claim 1, wherein the power supply comprises a battery.

8. The test verification circuit according to claim 1, further configured to illuminate a plurality of LEDs that provide visual confirmation of tested circuit status upon activation of the test verification circuit by the user.

9. The test verification circuit according to claim 8, wherein the plurality of LEDs comprises eight LEDs.

10. The test verification circuit according to claim 1, further comprising a user-activatable mechanism configured to provide activation of the N-channel MOSFET when temporarily powering the test verification circuit.

11. The test verification circuit according to claim 1, wherein the power outage is at least one of a DC power outage and an AC power outage.

12. A system that facilitates verifying operation of a tested circuit during a power outage, comprising:
    an ultra-low leakage test verification circuit for verifying proper operation of shock hazard warning circuit;
    an N-channel MOSFET configured for switching ON and OFF the test verification circuit during said power outage;
    a voltage source that provides an input voltage to the N-channel MOSFET; and
    a tested circuit that is diagnosed by the test verification circuit upon activation of the test verification circuit by a user during said power outage;
    wherein the N-channel MOSFET provides temporary power from a conserved power supply to the test verification circuit upon activation by the user;
    wherein the test verification circuit verifies whether the tested circuit has been de-energized;
    wherein the voltage source is a voltage multiplier circuit that receives power from the conserved power supply; and
    wherein the voltage multiplier circuit biases a potential at a gate of the N-channel MOSFET to a level greater than an operational voltage of the test verification circuit.

13. The test verification circuit according to claim 12, wherein the power supply comprises a supercapacitor that conserves charge upon a power outage for use by the N-channel MOSFET upon activation of the test verification circuit by the user.

14. The test verification circuit according to claim 12, wherein the power supply comprises a battery.

15. The test verification circuit according to claim 12, further configured to illuminate a plurality of LEDs that provide visual confirmation of safety operation circuit status upon activation of the test verification circuit by the user.

16. The test verification circuit according to claim 15, wherein the plurality of LEDs comprises eight LEDs.

17. The test verification circuit according to claim 12, further comprising a user-activatable mechanism configured to provide magnetic activation of the N-channel MOSFET when temporarily powering the test verification circuit.

* * * * *